(12) United States Patent
Zuk et al.

(10) Patent No.: US 6,242,919 B1
(45) Date of Patent: *Jun. 5, 2001

(54) MULTI-PROBE MRI/MRT SYSTEM

(75) Inventors: Yuval Zuk, Haifa; Ehud Katznelson, Ramat Yishai, both of (IL)

(73) Assignee: Odin Technologies Ltd., Yokneam Elit (IL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/963,850

(22) Filed: Nov. 4, 1997

(30) Foreign Application Priority Data

Nov. 4, 1996 (IL) ....................................................... 119558

(51) Int. Cl.[7] ...................................................... G01V 3/00
(52) U.S. Cl. ............................................. 324/322; 324/318
(58) Field of Search ..................................... 324/322, 318, 324/300, 312, 314, 307, 309

(56) References Cited

U.S. PATENT DOCUMENTS

| | | | |
|---|---|---|---|
| H1615 | 12/1996 | Leupold | 335/210 |
| 4,341,220 | 7/1982 | Perry | 128/630 |
| 4,608,977 | 9/1986 | Brown | 128/303 |
| 4,829,252 | 5/1989 | Kaufman | 324/309 |
| 4,875,485 | 10/1989 | Matsutani | 128/653 |
| 5,134,374 | 7/1992 | Breneman et al. | 324/319 |
| 5,304,933 | 4/1994 | Vavrek et al. | 324/318 |
| 5,332,971 | 7/1994 | Aubert | 324/319 |
| 5,365,927 | 11/1994 | Roemer et al. | 128/653 |
| 5,390,673 | 2/1995 | Kikinis | 128/653.2 |
| 5,410,287 | 4/1995 | Luskaris et al. | 335/216 |
| 5,428,292 | 6/1995 | Dorri et al. | 324/319 |
| 5,483,158 * | 1/1996 | Van Heteren et al. | 324/322 |
| 5,517,119 * | 5/1996 | Weinstock et al. | 324/322 |
| 5,565,779 * | 10/1996 | Arakawa et al. | 324/322 |
| 5,570,073 | 10/1996 | Muller | 335/299 |
| 5,677,630 | 10/1997 | Laskaris et al. | 324/320 |
| 5,696,449 | 12/1997 | Boskamp | 324/318 |

OTHER PUBLICATIONS

Guidelines for Establishing a Virtual Reality Lab, IEEE Engineering in Medicine and Biology, Mar./Apr. 1996.

* cited by examiner

*Primary Examiner*—Louis Arana
(74) *Attorney, Agent, or Firm*—Eitan, Pearl, Latzer & Cohen-Zedek

(57) ABSTRACT

A system for performing magnetic resonance imaging and magnetic resonance therapy and a method for operating the system. The system may include one or several magnetic probes and a single common controller connectable to the probes for calibrating and operating any selected one of the probes. The controller is particularly adapted for being used with probes optimized for performing magnetic resonance imaging or magnetic resonance therapy of a single specific body organ or with probes adapted for imaging of various different body organs, but can also be used with probes optimized for whole body imaging. Each of the probes is pre-calibrated and associated with a pre-calibration parameter set included in a probe-specific software program provided with each probe. The controller is used for selecting one of the probes, automatically calibrating the selected probe and operating the selected probe by using the pre-calibration parameter set and the specific software program of the selected probe. The automatic calibration includes real-time fine tuning of the system prior to imaging. The system is modular and expandable. The controller can be connected to a single probe for imaging. The controller can also be simultaneously connected to several probes but, at any given time, only one probe can be selected and operated with the controller for imaging. The probes may be distributed in different rooms. The system may also include display devices and/or virtual reality goggles connected to the controller.

63 Claims, 5 Drawing Sheets

MULTI-PROBE MRI/MRT SYSTEM

FIELD OF THE INVENTION

This invention relates to Magnetic Resonance Imaging (MRI) and Magnetic Resonance Therapy (MRT) medical systems.

BACKGROUND OF THE INVENTION

The principles of MRI are well summarized in several patents such as, for example, U.S. Pat. No. 5,304,933. A strong magnetic field is employed in order to align an object's nuclear spins along the z axis of a Cartesian coordinate system having mutually orthogonal x-y-z axes. This static field causes precession of the nuclei about the z-axis at a frequency known as the Larmor frequency $f = \gamma B_0$ where $\gamma$ is the gyromagnetic ratio and $B_0$ is the static field strength. Radio frequency (RF) coils are oriented within the x-y plane and are tuned to the Larmor frequency of the object, such that applying an RF pulse (frequently termed a 90° pulse) at the proper frequency causes the nuclear spins to rotate in the x-y plane. This gives rise to the emission of an RF signal which can be detected by the same RF coil or by a different RF coil located in the x-y plane. By such means an elemental slice of the object can be examined along the z-axis and through the x-y plane.

In order to produce the required, strong static field, MRI/MRT systems contain a magnet which must be able to produce a highly homogeneous field in the order of 0.1 to 2 Tesla. Homogeneity is critical in MRI/MRT applications because if the field strength is not properly uniform within the volume of interest, the desired discrimination between different elements will be distorted and subject to misinterpretation.

In order to scan a volume of the object, successive elemental slices must be canned along the z-axis. This is achieved by using gradient coils so as to vary the magnetic field strength along the z-axis. This ensures that the magnetic field strength along the z-axis varies so that the Larmor frequency is different for each elemental slice. An RF pulse at the frequency which corresponds to the desired slice to be excited is applied through the transmitting RF coil and excites the specific slice; the resulting excited RF signal being detected by the RF coil. By now varying the magnetic field strength along the z-axis, successive slices may be selected.

Each slice thus represents an incremental area in the x-y plane. In order to analyze each such slice and extract therefrom the pixel by pixel image data, x- and y-gradient coils are used respectively to vary the magnetic field strengths along the x- and y-axes and define intersecting elemental slices corresponding to a unique pixel. The axes can be rotated so as to create what is known as the oblique image.

The static magnetic field must be homogeneous or uniform in order to ensure an undistorted image or a good correspondence between pixel to pixel differences in the image and voxel to voxel differences in the object. Typical high homogeneous magnetic field strengths which are suited to MRI applications are uniform to within orders of 10 ppm within the volume of interest. Such uniformity is not susceptible to mass production. Each magnet must be shimmed in order to render the magnetic field uniform to within the required accuracy tolerance.

Most MRI systems to date introduce the patient into the static magnetic field and, to this end, employ a large magnet which effectively surrounds the patient. Such magnets are usually large superconductor magnets which are expensive but are unavoidable when whole body imaging is required. However, when only local imaging of small sections of body tissue are required, it becomes possible to contemplate the use of much more compact arrangements employing smaller magnets.

Furthermore, surrounding the patient with a magnet in such manner denies access to the patient and is thus not amenable to interventional imaging and/or therapy. U.S. Pat. No. 5,365,927 (Roemer et al.) describes a magnetic resonance imaging system employing an open magnet allowing access to a portion of a patient within an imaging volume. To this end, the cylindrical magnet of prior art systems which surrounds the patient is replaced by a substantially donut-shaped magnet into which the patient is placed and which provides images to a physician whilst allowing him to perform medical procedures. It is apparent that the desired access to the patient is achieved at the price of using a large magnet which allows the patient actually to lie in a supine position between the poles of the magnet.

Co-pending U.S. patent application to Ehud Katznelson et al., filed on Jul. 23, 1997 and entitled "PERMANENT MAGNET ASSEMBLIES FOR USE IN MEDICAL APPLICATIONS" now U.S. Pat. No. 5,900,793 incorporated herein by reference, discloses compact magnet assemblies useful for magnetic resonance imaging and for interventional magnetic resonance therapy applications. Such magnet assemblies have high homogeneity and may be adapted for use in MRI/MRT magnetic probe systems. Such magnetic probes can be constructed for effective imaging of various different body organs. Thus, customized magnetic probes can be constructed having suitably calibrated magnetic and mechanical properties for imaging a specific body organ. Alternatively, a single magnetic probe may be constructed for imaging of a plurality of various different body organs.

SUMMARY OF THE INVENTION

It is therefore an object of the present invention to provide a single MRI/MRT medical system having a single or multiple magnetic probes for imaging a plurality of body organs.

A feature of the system of the present invention is that the magnetic probes may be distributed in more than one room so that, for example, different probes can be employed during different medical procedures each being accommodated in a respective operating theater.

Such an approach will allow for the introduction of MRI technology into the operating theater and clinic rather than the other way around. Moreover, the magnetic probe can be combined with a stereotactic frame incorporating a universal holder mechanism for guiding a surgical tool to a target, as is done during head and brain surgical procedures, for example.

In its simplest form, the system according to the invention includes a selection means within the central electronics system for selecting a single one of the probes, there being further provided an automatic calibration means coupled to the selection means and responsive to the selected probe for automatically calibrating the selected probe. The calibration parameters are downloaded from a software program provided with each probe to an acquisition computer in the central electronics system, thus allowing automatic calibration of the selected probe.

Such a selection means permits a single probe to be selected at any given time, thereby permitting a relatively simple system to be provided since only a single channel need be employed for connecting the plurality of probes to the central electronics system.

There is therefore provided in accordance with a preferred embodiment of the present invention a system for performing magnetic resonance imaging and magnetic resonance therapy. The system includes a plurality of magnetic probes and a controller connectable to each of the plurality of magnetic probes for calibrating and operating any selected one of the plurality of magnetic probes.

Further, in accordance with a preferred embodiment of the present invention, the controller includes a host computer for selecting one of the plurality of magnetic probes and for controlling the calibration and operation of the selected one of the plurality of magnetic probes and a central electronics system coupled to the host computer and connectable to each of the plurality of magnetic probes for calibrating and operating the selected one of the plurality of magnetic probes.

Further yet, in accordance with still another preferred embodiment of the present invention, the central electronics system includes a selection means for selecting a single one of the plurality of magnetic probes and an automatic calibration means coupled to the selection means and responsive to the selected one of the plurality of magnetic probes for automatically calibrating the selected one of the plurality of magnetic probes.

Furthermore, in accordance with a preferred embodiment of the present invention, the magnetic probes are distributed in more than one room.

Furthermore, in accordance with a preferred embodiment of the present invention, at least one of the magnetic probes includes a recess means for accommodating a surgical tool therethrough.

Furthermore, in accordance with a preferred embodiment of the present invention, the system includes at least one display device coupled to the host computer for displaying images acquired by the system.

Furthermore, in accordance with a preferred embodiment of the present invention, the plurality of magnetic probes is distributed in a plurality of rooms and at least one display device in each room of the plurality of rooms is coupled to the host computer for displaying the images generated by using any of the magnetic probes in the room.

Furthermore, in accordance with a preferred embodiment of the present invention, at least one of the plurality of magnetic probes is integrated with a stereotactic frame.

Furthermore, in accordance with a preferred embodiment of the present invention, at least one of the display devices includes a virtual reality display device.

There is also provided, in accordance with a preferred embodiment of the present invention, a modular system for performing magnetic resonance imaging and magnetic resonance therapy. The system includes at least one magnetic probe and a controller connected to the at least one magnetic probe for calibrating and operating one of the at least one magnetic probe.

Furthermore, in accordance with a preferred embodiment of the present invention, the controller includes a central electronics system connectable to the at least one magnetic probe. The central electronic system is capable of calibrating and operating any magnetic probe selected from a plurality of magnetic probes compatible with the modular system and a host computer coupled to the central electronics system for selecting one of the at least one magnetic probe and for controlling the calibration and operation of the selected magnetic probe.

Furthermore, in accordance with a preferred embodiment of the present invention, each of the plurality of magnetic probes is pre-calibrated to provide a pre-calibration parameters set. The pre-calibration parameters set is included in a software program provided with each of the plurality of magnetic probes for calibration and operation thereof. The software program is operable on the host computer.

There is also provided, in accordance with a preferred embodiment of the present invention, a controller used in a multi-probe system for performing magnetic resonance imaging and magnetic resonance therapy. The controller is connectable to at least one of a plurality of magnetic probes. The controller includes means for selecting one of the plurality of magnetic probes, means for automatically calibrating the selected one of the plurality of magnetic probes and means for operating the selected one of the plurality of magnetic probes.

Furthermore, in accordance with a preferred embodiment of the present invention at least one of the plurality of magnetic probes is optimized for performing magnetic resonance imaging or magnetic resonance therapy of a specific body organ.

Furthermore, in accordance with a preferred embodiment of the present invention at least one of the plurality of magnetic probes is optimized for performing whole body magnetic resonance imaging or whole body magnetic resonance therapy.

Furthermore, in accordance with a preferred embodiment of the present invention, at least one of said plurality of magnetic probes is adapted for performing magnetic resonance imaging or magnetic resonance therapy of a plurality of specific body organs.

Furthermore, in accordance with a preferred embodiment of the present invention, at least one of the plurality of magnetic probes is a compact mobile magnetic probe adapted for use within an operating room.

There is also provided, in accordance with a preferred embodiment of the present invention, a method for operating a magnetic probe selected from a plurality of magnetic probes for performing magnetic resonance imaging and magnetic resonance therapy in a system including a common controller connectable to at least one of the plurality of magnetic probes. The method includes the steps of pre-calibrating each of the plurality of magnetic probes for use with the common controller to provide a plurality of pre-calibration parameters sets, each set of calibration parameters is associated with one of the plurality of magnetic probes, selecting a magnetic probe out of the plurality of magnetic probes, providing the pre-calibration parameter set associated with the magnetic probe to the common controller, automatically calibrating the magnetic probe using the pre-calibration parameter set associated with the magnetic probe and operating the magnetic probe to perform image acquisition.

Furthermore, in accordance with a preferred embodiment of the present invention, the step of automatically calibrating includes the steps of tuning a radio frequency receiver and a radio frequency transmitter included in the common controller in accordance with the pre-calibration parameter set, calibrating the gradient coil amplifiers included in the common controller for generating gradient coil currents in accordance with the pre-calibration parameter set and fine-tuning the currents supplied by a shim coil power supply included in the common controller to achieve a predetermined value of main magnetic field homogeneity.

Furthermore, in accordance with a preferred embodiment of the present invention, the pre-calibration parameter set is included in a software program provided with the magnetic probe and operating on the common controller.

Furthermore, in accordance with a preferred embodiment of the present invention, the controller includes a digital radio frequency receiver which includes an analog to digital converter operating in conjunction with radio frequency receiver software. The digital radio frequency receiver receives and processes radio frequency signals within a frequency range extended to include all the frequencies required for operating any magnetic probe of the plurality of magnetic probes.

Finally, in accordance with a preferred embodiment of the present invention, the controller includes a digital radio frequency transmitter. The digital radio frequency transmitter includes a digital to analog converter operating in conjunction with radio frequency transmitter software for transmitting radio frequency signals within a frequency range extended to include all the frequencies required for operating any of the plurality of magnetic probes.

BRIEF DESCRIPTION OF THE DRAWINGS

In order to understand the invention and to see how the same may be carried out in practice, a preferred embodiment will now be described, by way of non-limiting example only, with reference to the accompanying drawings, in which.

DETAILED DESCRIPTION OF A PREFERRED EMBODIMENT

Figure 1:
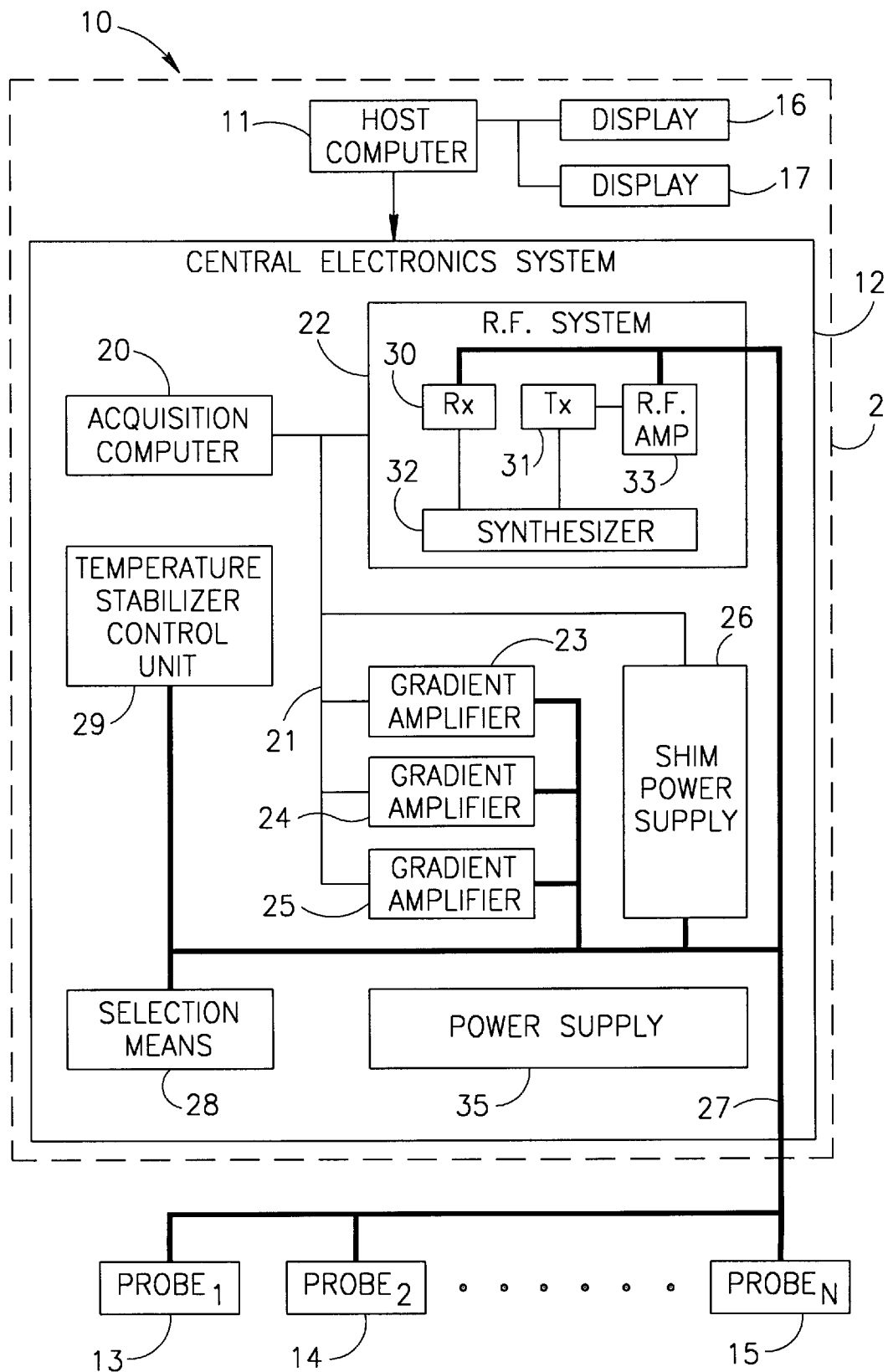
FIG. 1 is a block diagram showing functionally a MRI/MRT medical system according to the invention.

FIG. 1 shows a MRI/MRT system 10 including a controller 2 and a plurality of magnetic probes 13, 14 and 15. The controller 2 includes a host computer 11 coupled to a central electronics system 12 for operating the plurality of magnetic probes 13, 14 and 15 which may, if desired, be located in different rooms such as discrete operating theaters and the like. The host computer 11 may likewise be coupled to a plurality of display devices 16 and 17 which likewise may be provided in different locations so as to permit more than one operator to observe the image produced by the system 10.

The central electronics system 12 comprises an acquisition computer 20 containing a database of calibration parameters associated with each of the probes 13, 14 and 15. The acquisition computer 20 is coupled by means of a common digital bus 21 to an RF system 22, three gradient amplifiers 23, 24 and 25 and a shim power supply 26. An output of each of the gradient amplifiers 23, 24 and 25 as well as of the shim power supply 26 are connected to a common analog bus 27 to which the probes 13, 14 and 15 are switchably connected (the switches are not shown). Likewise, connected to the common analog bus 27, are a selection means 28 for selecting a desired one of the probes 13, 14 and 15 and a temperature control unit 29. The selection means 28 selects the desired probe by, inter alia, connecting the desired probe to the analog bus 27 and disconnecting the remaining probes from the analog bus 27, using the appropriate switches (not shown).

The RF system 22 includes an RF receiver (Rx) and an RF transmitter (Tx) 30 and 31, respectively, which are connected to a synthesizer 32 for producing synchronization (clocking) signals, the RF transmitter 31 also being connected to an RF amplifier 33. The RF receiver 30 as well as the RF amplifier 33 are connected to the common analog bus 27. The various components within the central electronics system 12 are energized by means of an internal power supply designated 35 whose connections to the various functional components are not shown.

The host computer 11 is used, inter alia, to control the operation of the central electronics system 12 and of the acquisition computer 20 and to download to the acquisition computer 20 appropriate software and data required for performing specific acquisition sequences by the acquisition computer 20 and the central electronics system 12. The host computer 11 is also used for performing part of the processing of the signals acquired by the acquisition computer 20. The host computer 11 is also used for inputting and for accessing patient demographic data, either directly or by being part of a local area network (LAN) or a wide area network (WAN) (not shown) and by suitably communicating with common databases located on remote computers (not shown) which are part of the LAN or WAN in the hospital or clinic.

The host computer 11 is also used for displaying the MRI/MRT images on display devices 16 and 17, or on any other suitable nearby or remote display devices (not shown).

It is noted that, the disclosed division of tasks between the host computer 11 and the acquisition computer 20 is given only by example, and that many other embodiments of the system are possible having different distributions of the various control, acquisition and image processing and displaying tasks between the host computer 11 and the acquisition computer 20 which are included within the scope of the present invention. Additionally, the controller 2 may also include additional microprocessors (not shown) functioning as parts of various digital signal processing (DSP) boards (not shown) included within the controller 2 or as co-processors in the host computer 11.

Figure 2:
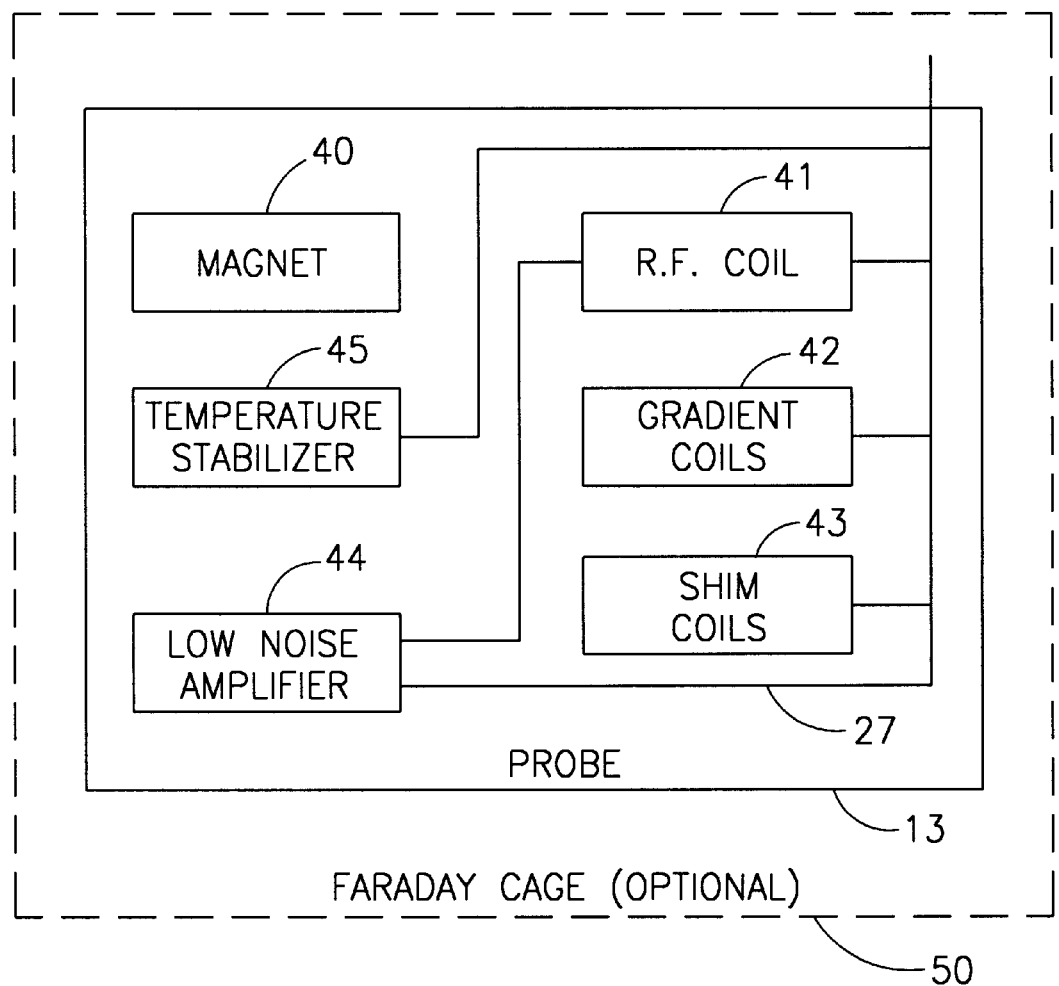
FIG. 2 is a block diagram showing functionally a detail of a probe for use in the system shown in FIG. 1.

Turning now to FIG. 2 of the drawings, there is shown a functional diagram of the probe 13, it being understood that the remaining probes 14 and 15 are of similar functional construction. Thus, the probe 13 includes a magnet 40 associated with which are an RF coil 41, gradient coils 42 and shim coils 43 all commonly connected to the analog bus 27 to which a low noise amplifier 44 and a temperature stabilizer 45 are also connected. The low noise amplifier 44 is also connected to the RF coil 41.

The RF coil 41 may comprise a number of coils e.g. transmit and receive coils (not shown) or an array of transmit and receive coils (not shown), etc. Optionally, the probe 13 may be disposed within a schematically depicted Faraday cage 50 for effectively isolating the probe 13 from stray electromagnetic interference The construction and operation of the various magnetic and electronic components within the probe 13 are well known to those skilled in the art and will therefore not be described in further detail. The difference between the various probes 13, 14 and 15 relates to their magnetic and mechanical properties. So far as mechanical properties are concerned, it will be understood that the probes may be shaped differently in order to be more readily adapted to different body organs. For example, a substantially U-shaped probe may be employed for MRI/MRT imaging of a patient's head whilst a planar magnetic probe may be used for local imaging of a patient's back. The actual shapes of the specific probes 13, 14 and 15 shown functionally in FIG. 1 are not themselves a feature of the present invention but, rather, merely the fact that the probes are interchangeable and that different probes may be provided each being magnetically and mechanically optimized for imaging of a specific body organ.

Likewise, the gradient coils 42 as well as the RF coil 41 in each of the probes 13, 14 and 15 must be specifically designed for proper imaging of the body organ associated with the respective probe, this design being not only mechanical but also magnetic as will be disclosed hereinafter.

It is noted that, in accordance with another preferred embodiment of the present invention, at least one of the N probes 13,14 and 15 may be a magnetic probe optimized for whole body imaging.

So far as the different magnetic properties of the various probes 13, 14 and 15 are concerned, the magnet 40 in each of the probes has a different field intensity ($B_0$) thus giving rise to different Larmor frequencies owing to the relationship between Larmor frequency f and magnetic field strength ($B_0$) described in the opening section of the specification. For this reason, selection of a different magnet (i.e. a different probe) requires pre-calibration of the RF receiver 30 and the RF transmitter 31 within the RF system 22. This, of course, being a common system regardless of the number of probes connected thereto by the analog bus 27.

Calibration of the RF receiver 30 and the RF transmitter 31 in order to adapt the magnet 40 in each of the probes 13, 14 and 15 to respective Larmor frequencies is known per se and therefore does not require further description. Typically, the probe is pre-calibrated by the manufacturer and the pre-calibration data are included with the software package which is supplied with each magnetic probe for operating and calibrating the probe. The required calibration data are typically downloaded from the host computer 11 and stored in a database within the acquisition computer 20 so as to be extracted therefrom in response to a signal generated by the selection means 28 and fed to the analog bus 27, in accordance with which one of the probes 13, 14 and 15 is selected.

Amongst the calibration parameters stored in the acquisition computer 20 are the receiver gain relating to the RF receiver 30 and corresponding to each one of the probes 13, 14 and 15. In this connection, it is to be noted that the magnetic field strength $B_0$ has a strong effect on the signal-to-noise (S/N) ratio of the Free Induction Decay (FID) signal produced by the MRI/MRT system 10.

As will also be understood, the gradient field strengths vary from one magnet to another because of the specific design of each gradient coil 42 in the selected probes 13, 14 or 15. Likewise, the shim coils 43 will also be different in order to preserve the homogeneity of the respective magnet 40. Therefore, the calibration parameters of the gradient coils 42 and the shim coils 43 are stored in the acquisition computer 20 in addition to the receiver gain of the RF receiver 30.

As noted above, upon selecting a particular probe the calibration parameters are extracted from the database and are used with the RF system, the gradient system and the shim system. The shim coils are fine-tuned in real time whenever a probe is selected.

Figure 3:
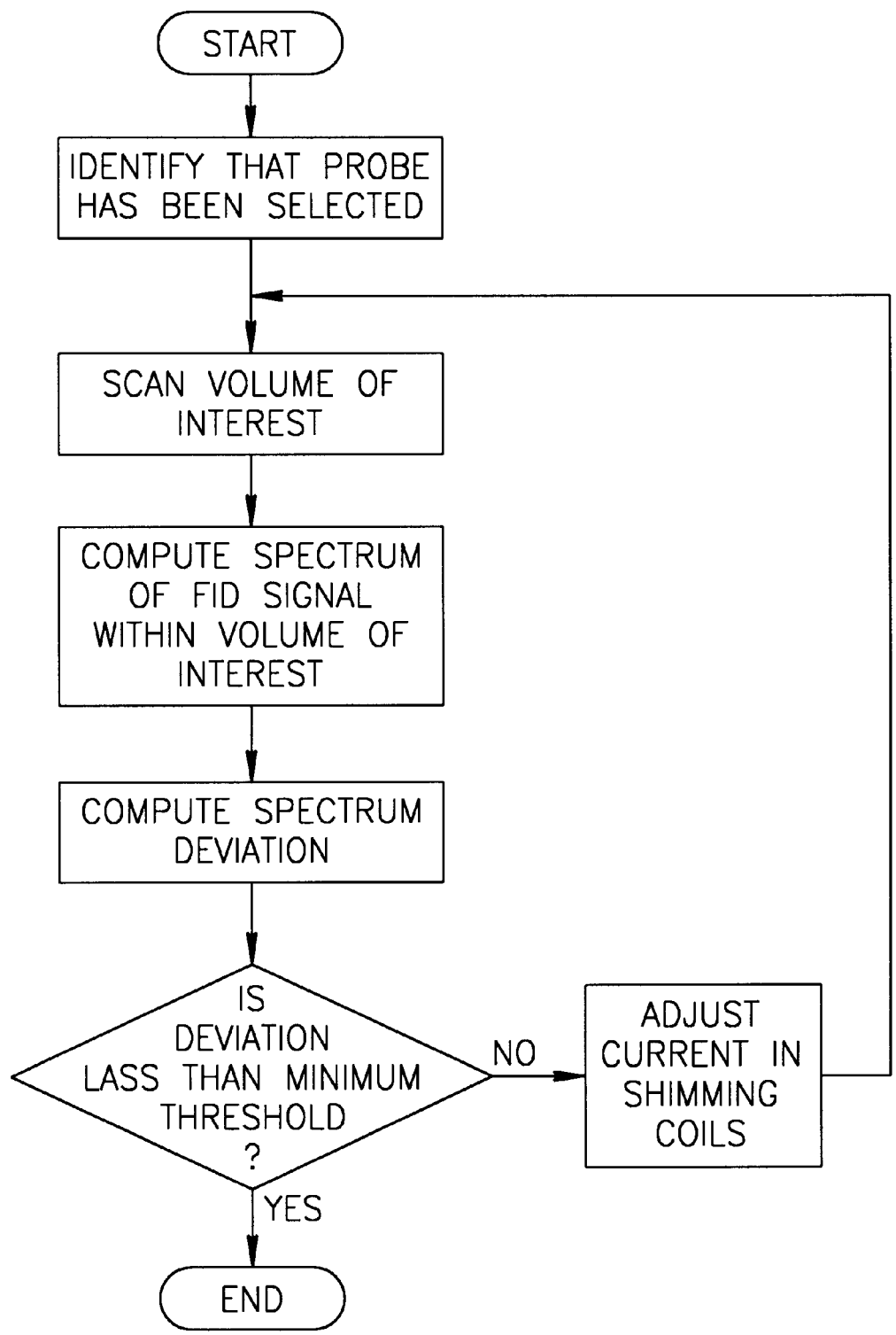
FIG. 3 is a flow diagram showing the principal operating steps in an automatic shimming process for use in the system shown in FIG. 1.

FIG. 3 is a flow diagram showing the principal calibration steps associated with fine-tuning of the shim coils. Whenever a new probe is selected, the new probe is identified by the system, the approximate pre-calibration parameters of the software package are downloaded from the host computer 11 to the database are extracted from the database and the corresponding shim coil current is fed to the shim coils. At this stage, no currents are applied to the gradient coils so that the whole volume of interest is excited at a magnetic field intensity $B_0$ corresponding to the Larmor frequency f in accordance with the relationship $f=\gamma B_0$. The volume of interest is now scanned and the frequency spectrum within the volume of interest is computed. If the magnet were ideally homogeneous, then the frequency spectrum of the FID signal would show a single narrow peak at the Larmor frequency f. In practice, the magnet is not ideally homogeneous and the frequency spectrum is therefore spread out so that a Fourier analysis thereof indicates several frequency components. The current fed to the shim coils is therefore changed and the process is repeated until a sufficiently narrow frequency spectrum is obtained centered at the Larmor frequency f.

Each of the probes 13, 14 and 15 may, if desired, include a permanent magnet. Since the homogeneity of permanent magnets is markedly temperature sensitive and subject to fluctuation of 1000 ppm/° C. very accurate temperature stabilization is required in order to maintain the homogeneity of such permanent magnets. Such temperature stabilization is achieved by the temperature stabilizer control unit 29 connected, via the analog bus 27, to each of the probes 13, 14 and 15.

The acquisition computer 20 includes therein a plurality of DSP boards which control the gradient amplifiers 23, 24 and 25, the shim power supply 26, the RF system 22 and also perform the initial processing of the FID signal and the fast Fourier transform (FFT) thereof.

Figure 4:
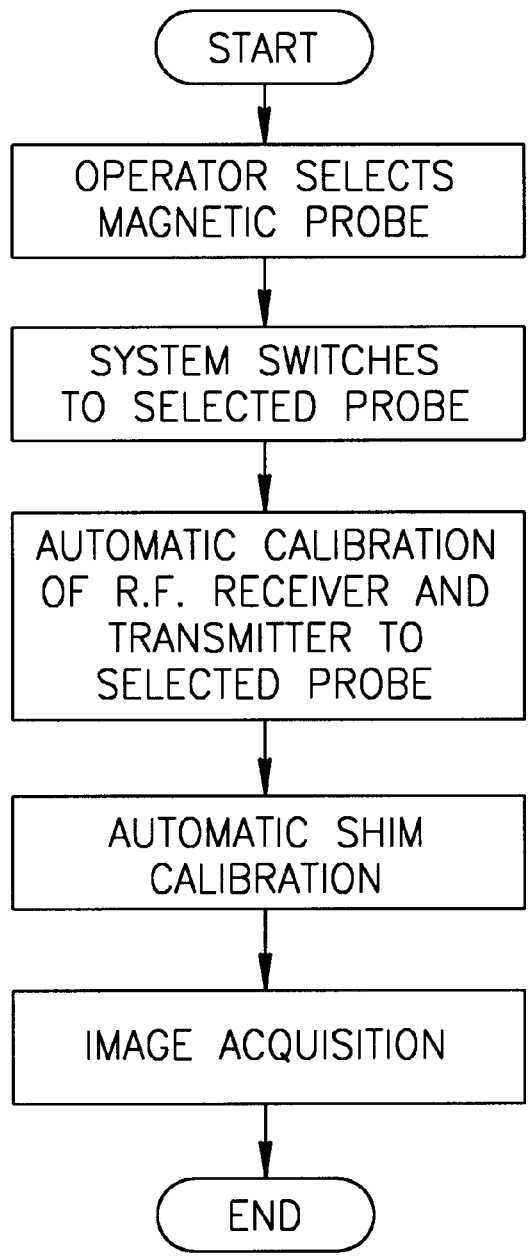
FIG. 4 is a flow diagram showing the principal operating steps for operating the system shown in FIG. 1.

FIG. 4 is a flow diagram showing the principal calibration steps associated with selection of a particular probe. Thus, a physician first selects a desired magnetic probe using the selection means 28. The system 10 then switches to the selected probe and the acquisition computer 20 is responsive to the selection means 28 for achieving automatic calibration of the RF receiver 30 and RF transmitter 31 in accordance with the pre-calibration parameters stored in the acquisition computer 20 in respect of the selected probe. Likewise, the acquisition computer 20 performs automatic calibration of the gradient coil parameters and of the shim coil parameters. This having been done, the system 10 is correctly calibrated for the selected probe and image acquisition is now effected.

Figure 5:
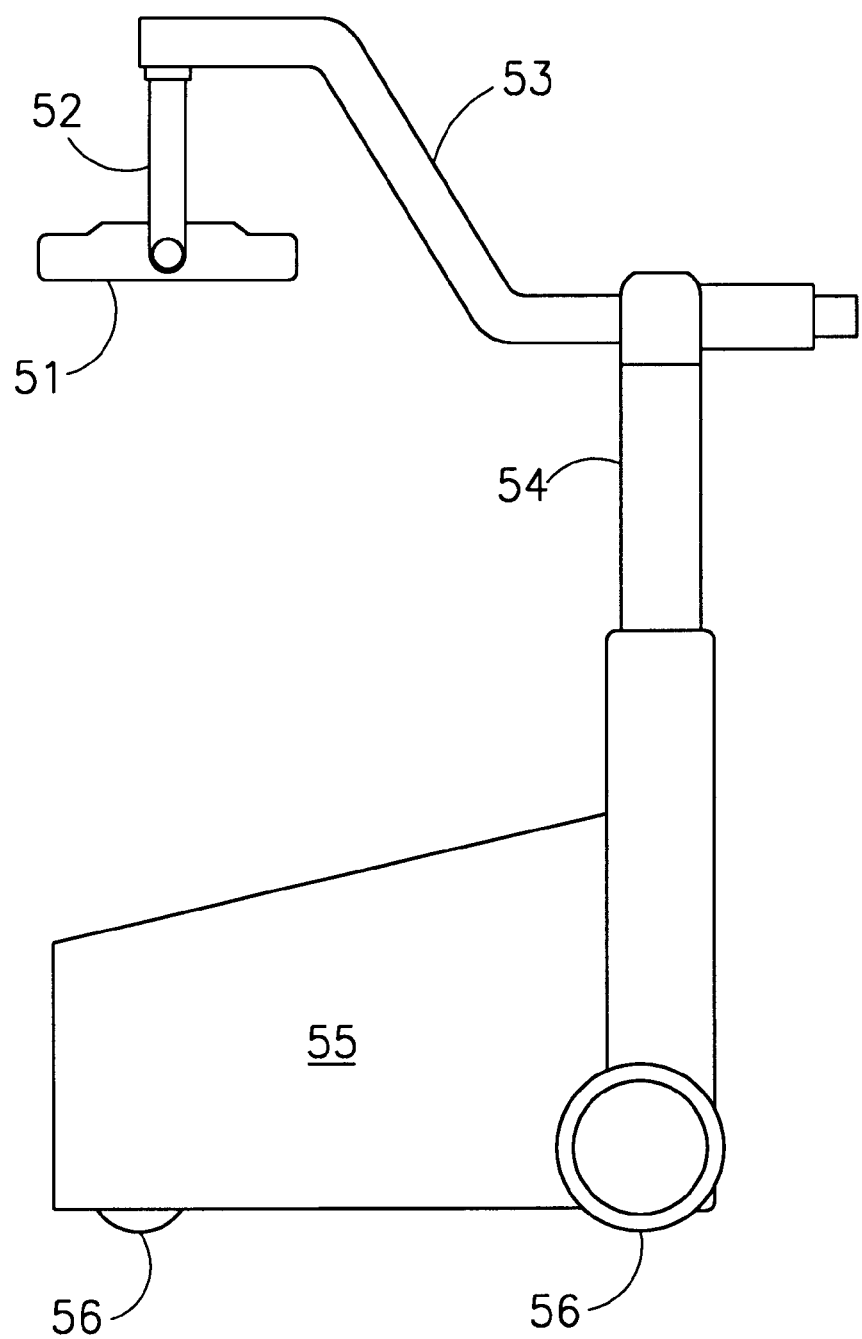
FIG. 5 is a pictorial representation of part of the system shown in FIG. 1 having an adjustable probe for easy alignment with a body organ.

FIG. 5 is a pictorial view of a probe 51 pivotally mounted on an arm 52 which is itself rotatably mounted about a vertical axis within a support 53. The support 53 is rotatably supported about a horizontal axis within a stanchion 54 which is itself vertically displaceable within a base unit 55. The base unit 55 is provided with castors 56 facilitating transportation thereof and houses part of the electronics associated with the system as described above with reference to FIG. 1 of the drawings. It will thus be seen that the probe 51 is adapted for free rotation about all three mutually orthogonal axes as well as being manipulable along both vertical and horizontal axes It is therefore easy to adjust the probe mechanically in order to align it with a patient's body organ, as required after the patient has been arranged in situ.

A preferred embodiment of the present invention also contemplates the provision of several different probes each optimized for a different body organ and mounted on a single moveable frame for aligning a desired one of the probes with a patient's body organ, as required. Different probes may then be aligned with respective body organs in a manner similar to that employed in X-Ray machines. In the invention, the probe 51 and associated supports may be ceiling mounted in a manner similar to that employed for supporting multiple lamps in an operating theater illumination unit.

It is noted that, in contrast with electronic systems of prior art MRI/MRT systems which are optimized for operation with a single probe, the central electronics system 12 of the present invention is designed to be operated in conjunction with different probes. Thus, taking into account the different magnetic and mechanical properties of the range of available probes, the RF system 12 must be designed to operate using a range of RF frequencies and the gradient amplifiers 21, 24 and 25 must be designed to provide suitable currents for operation of all the relevant gradient coils of the different probes.

In accordance with one preferred embodiment of the present invention, the required RF range of the RF receiver 30 can be achieved by implementing the RF receiver 30 in software and by using a high-speed analog to digital (A/D) converter for sampling the output of the low noise amplifier 44 of the probe 13. The A/D converter is suitably connected to a programmable downconverter (not shown). A non-limiting example of such a programmable downconverter is the programmable downconverter model HSP 50214, commercially available from Harris Semiconductor Corporation, Fl, U.S.A.

The RF transmitter 31 of the RF system 22 can be implemented using a high speed digital to analog (D/A) converter suitably connected to a programmable upconverter. A non-limiting example of such a programmable upconverter is the programmable upconverter model HSP 50215, commercially available from Harris Semiconductor Corporation, Fl, U.S.A.

The sampled digitized RF signal is further processed by the RF receiver software operating on a dedicated digital signal processor (DSP) board (not shown) or on the microprocessor (not shown) of the host computer 11 (FIG. 1), or on any other suitable processing unit (not shown).

It is noted that, while the RF receiver 30 and the RF transmitter 31 of the present invention are implemented by way of example as a digital RF receiver and transmitter, respectively, the RF receiver 30 and the RF transmitter 31 can be any suitable RF receiver and RF transmitter, respectively. For example, in accordance with another preferred embodiment of the present invention, the RF receiver 30 and the RF transmitter 31 may be an analog RF receiver and transmitter, respectively.

Additionally, in accordance with another preferred embodiment of the present invention, the RF receiver 30 and the RF transmitter 31 may be a multi-channel RF receiver and a multi-channel RF transmitter, respectively.

It is also noted that the display devices 16 and 17 shown in FIG. 1 may be partially constituted by virtual reality goggles such as are described, for example, in *Guidelines for Establishing a Virtual Reality Lab* appearing in IEEE Engineering in Medicine and Biology, March/April 1996. Such an approach gives the surgeon complete flexibility to perform surgery whilst all the time seeing an image of the MRI/MRT image regardless of hishead movements.

It is further to be understood that the probes of the present invention may be integrated with known stereotactic frames as disclosed in U.S. Pat. Nos. 4,341,220 and 4,608,977 incorporated herein by reference.

It is still further noted that the system 10 utilizes a common host computer 11 and central electronics system 12 for controlling as many different probes as required. Consequently, the major expense of the system 10 is shared by all of the probes and, by means of the invention, there is provided the diagnostic potential of a large number of MRI/MRT systems but at a fraction of the price.

It is further noted that, an additional advantage of the system of the present invention is the modularity of the system. In contrast with prior art MRI systems which include a probe and dedicated electronic and control systems which are tuned for use with a single probe, the system of the present invention includes a common control and electronics system that can be used in conjunction with a probe selected from a plurality of probes. The electronics system is automatically calibratable and tunable for use with any selected one of the plurality of probes by using an appropriate software package supplied with each different probe. Thus, various possible configurations of the system are possible. For example, the system may initially include only one type of magnetic probe such as a magnetic probe optimized for use in head surgery. In this case, the system uses the software package supplied with the brain surgery probe.

As the needs of the clinic or hospital change, additional probes may be purchased each of which can be operated using the common controller 2 of the system and the software package supplied with each of the additional magnetic probes for calibrating and operating the magnetic probe.

It will be appreciated by persons skilled in the art that the present invention is not limited by what has been particularly shown and described herein above and that numerous modifications, all of which fall within the scope of the present invention, exist. Rather the scope of the invention is defined by the claims which follow:

What is claimed is:

1. A system for performing magnetic resonance imaging and magnetic resonance therapy, the system comprising:

a plurality of magnetic probes, each magnetic probe of said plurality of magnetic probes includes at least one magnet, at least one radio frequency coil and gradient coils adapted for performing magnetic resonance imaging; and a controller operatively connectable to each magnetic probe selected from said plurality of magnetic probes for calibrating and operating any magnetic probe selected from said plurality of magnetic probes.

2. The system according to claim 1 wherein said controller comprises:

at least one computer for selecting one magnetic probe from said plurality of magnetic probes and for controlling the calibration and operation of said magnetic probe selected from said plurality of magnetic probes; and a central electronics system operatively coupled to said at least one computer and connectable to each magnetic probe of said plurality of magnetic probes for calibrating and operating said magnetic probe selected from said plurality of magnetic probes.

3. The system according to claim 2, wherein said central electronics system comprises:

a selection means for selecting a single magnetic probe of said plurality of magnetic probes; and an automatic calibration means operatively coupled to said selection means and responsive to the selection of said magnetic probe from said plurality of magnetic probes for automatically calibrating said magnetic probe selected from said plurality of magnetic probes.

4. The system according to claim 2, further comprising at least one display device coupled to said at least one computer displaying images acquired by said system.

5. The system according to claim 4, wherein said plurality of magnetic probes is distributed in a plurality of rooms and wherein at least one display device in each room of said plurality of rooms is operatively coupled to said at least one computer for displaying the images generated by using any of the magnetic probes disposed in said room.

6. The system according to claim 4, wherein at least one of said at least one display device comprises a virtual reality display device.

7. The system according to claim 2, wherein said central electronics system comprises:
   an automatic calibration unit operatively coupled to said at least one computer and responsive to the selection by said at least one computer of said magnetic probe from said plurality of magnetic probes for automatically calibrating said magnetic probe selected from said plurality of magnetic probes; and
   a connecting unit for operatively connecting the magnetic probe selected by said at least one computer from said plurality of magnetic probes to said central electronics system.

8. The system according to claim 7, wherein said connecting unit comprises a plurality of switches for controllably connecting said magnetic probe selected from said plurality of magnetic probes to said central electronics system and for disconnecting the remaining magnetic probes of said plurality of magnetic probes from said central electronics system.

9. The system according to claim 8, wherein said central electronics system comprises an analog bus switchably connectable to a selected magnetic probe of said plurality of magnetic probes by controllably switching said plurality of switches.

10. The system according to claim 2, wherein said central electronics system comprises:
    a selection unit for selecting a single magnetic probe of said plurality of magnetic probes; and
    an automatic calibration unit operatively coupled to said selection unit and responsive to the selection of said magnetic probe from said plurality of magnetic probes for automatically adjusting said central electronics system for operation with said magnetic probe selected from said plurality of magnetic probes.

11. The system according to claim 2, wherein said central electronics system comprises:
    a selection means for selecting a single magnetic probe of said plurality of magnetic probes; and
    an automatic calibration means operatively coupled to said selection means and responsive to the selection of said magnetic probe from said plurality of magnetic probes for automatically adjusting said central electronics system for operation with said magnetic probe selected from said plurality of magnetic probes.

12. The system according to claim 1 wherein at least one of said plurality of magnetic probes is optimized for performing magnetic resonance imaging or magnetic resonance therapy of a specific body organ.

13. The system according to claim 1 wherein at least one of said plurality of magnetic probes is optimized for performing whole body magnetic resonance imaging or whole body magnetic resonance therapy.

14. The system according to claim 1, wherein the magnetic probes of said plurality of magnetic probes are distributed in more than one room.

15. The system according to claim 1, wherein at least one magnetic probe of said plurality of magnetic probes includes a recess means for accommodating a surgical tool therethrough.

16. The system according to claim 1, wherein at least one magnetic probe of said plurality of magnetic probes is integrated with a stereotactic frame.

17. The system according to claim 1, wherein said controller includes a digital radio frequency receiver comprising an analog to digital converter operating in conjunction with radio frequency receiver software, said digital radio frequency receiver receiving and processing radio frequency signals within a frequency range extended to include all the frequencies required for operating any magnetic probe of said plurality of magnetic probes.

18. The system according to claim 1 wherein at least one magnetic probe of said plurality of magnetic probes is adapted for performing magnetic resonance imaging or magnetic resonance therapy of a plurality of specific body organs.

19. The system according to claim 1, wherein said controller includes a digital radio frequency transmitter comprising a digital to analog converter operating in conjunction with radio frequency transmitter software, said digital radio frequency transmitter is capable of transmitting radio frequency signals within a frequency range extended to include all the frequencies required for operating any magnetic probe of said plurality of magnetic probes.

20. The system according to claim 1, wherein at least one magnetic probe of said plurality of magnetic probes further comprises at least one shim coil.

21. A modular system for performing magnetic resonance imaging and magnetic resonance therapy, the system comprising:
    at least one magnetic probe including at least one magnet, at least one radio frequency coil and gradient coils adapted for performing magnetic resonance imaging; and
    a controller operatively connectable to said at least one magnetic probe for calibrating and operating said at least one magnetic probe, said controller is configured for operating a magnetic probe selected from at least two magnetic probes adapted for use with said controller, each of said at least two magnetic probes includes at least one magnet, at least one radio frequency coil and gradient coils adapted for performing magnetic resonance imaging.

22. The modular system according to claim 21, wherein said controller comprises:
    a central electronics system operatively connectable to said at least one magnetic probe, said central electronic system is capable of calibrating and operating any magnetic probe selected from said at least two magnetic probes; and
    at least one computer operatively coupled to said central electronics system, said at least one computer is configured for selecting one magnetic probe of said at least two magnetic probes and for controlling the calibration and operation of the magnetic probe selected from said at least two magnetic probes.

23. The modular system according to claim 21 wherein said at least one magnetic probe is optimized for performing magnetic resonance imaging or magnetic resonance therapy of a specific body organ.

24. The modular system according to claim 21 wherein said at least one magnetic probe is optimized for performing whole body magnetic resonance imaging or whole body magnetic resonance therapy.

25. The modular system according to claim 21 wherein said at least one magnetic probe is pre-calibrated to provide a pre-calibration parameter set and wherein said pre-calibration parameter set is included in a software program provided with said at least one magnetic probe for calibration and operation thereof, said software program being operable on said controller.

26. The modular system according to claim 21 wherein said at least one magnetic probe is adapted for performing magnetic resonance imaging or magnetic resonance therapy of a plurality of specific body organs.

27. The modular system according to claim 21, wherein said at least one magnetic probe further comprises at least one shim coil.

28. The modular system according to claim 21, wherein said controller comprises:
   a central electronics system operatively connectable to said at least one magnetic probe, said central electronic system is configured for calibrating and operating any magnetic probe selected from said at least two magnetic probes; and
   at least one computer operatively coupled to said central electronics system, said at least one computer is configured for identifying the magnetic probe operatively connected to said central electronics system, for controlling the calibrating of the magnetic probe operatively connected to said central electronics system, and for automatically adjusting said central electronic system for operating with the magnetic probe operatively connected to said central electronics system.

29. A controller used in a multi-probe system for performing magnetic resonance imaging and magnetic resonance therapy, the controller is connectable to at least one magnetic probe of a plurality of magnetic probes, each magnetic probe of said plurality of magnetic probes includes at least one magnet, at least one radio frequency coil and gradient coils adapted for performing said magnetic resonance imaging, the controller comprising:
   means for selecting one magnetic probe of said plurality of magnetic probes;
   means for automatically calibrating the magnetic probe selected by said means for selecting; and
   means for operating the magnetic probe selected by said means for selecting.

30. The controller according to claim 29 wherein at least one magnetic probe of said plurality of magnetic probes is optimized for performing magnetic resonance imaging or magnetic resonance therapy of a specific body organ.

31. The controller according to claim 29, wherein at least one magnetic probe of said plurality of magnetic probes is a compact mobile magnetic probe adapted for use within an operating room.

32. The controller according to claim 29, wherein at least one magnetic probe of said plurality of magnetic probes is optimized for performing whole body magnetic resonance imaging or whole body magnetic resonance therapy.

33. The controller according to claim 29, wherein said controller includes a digital radio frequency receiver comprising an analog to digital converter operating in conjunction with radio frequency receiver software for receiving and processing radio frequency signals within a frequency range extended to include all the frequencies required for operating any magnetic probe of said plurality of magnetic probes.

34. The controller according to claim 29 wherein at least one magnetic probe of said plurality of magnetic probes is adapted for performing magnetic resonance imaging or magnetic resonance therapy of a plurality of specific body organs.

35. The controller according to claim 29, wherein said controller includes a digital radio frequency transmitter comprising a digital to analog converter operating in conjunction with radio frequency transmitter software, said digital radio frequency transmitter is capable of transmitting radio frequency signals within a frequency range extended to include all the frequencies required for operating any magnetic probe of said plurality of magnetic probes.

36. The controller according to claim 29 wherein at least one magnetic probe of said plurality of magnetic probes further comprises at least one shim coil.

37. A method for operating a magnetic probe selected from a plurality of magnetic probes for performing magnetic resonance imaging and magnetic resonance therapy in a system including a common controller connectable to at least one of said plurality of magnetic probes, each magnetic probe of said plurality of magnetic probes includes at least one magnet, at least one radio frequency coil and gradient coils adapted for performing said magnetic resonance imaging, the method comprising the steps of:
   pre-calibrating each magnetic probe of said plurality of magnetic probes for use with said common controller to provide a plurality of pre-calibration parameter sets, each pre-calibration parameter set of said plurality of pre-calibration parameter sets is associated with one magnetic probe of said plurality of magnetic probes;
   selecting a magnetic probe out of said plurality of magnetic probes;
   providing the pre-calibration parameter set associated with the magnetic probe selected in said step of selecting to said common controller;
   automatically adjusting said common controller for use with the magnetic probe selected in said step of selecting using said pre-calibration parameter set associated with said magnetic probe provided in said step of providing; and
   operating the magnetic probe selected in said step of selecting to perform magnetic resonance image acquisition.

38. The method according to claim 37 wherein said step of automatically adjusting comprises the steps of:
   tuning a radio frequency receiver and a radio frequency transmitter included in said common controller in accordance with said pre-calibration parameter set provided in said step of providing;
   calibrating gradient coil amplifiers included in said common controller for generating gradient coil currents in accordance with said pre-calibration parameter set provided in said step of providing; and
   fine-tuning the currents supplied by a shim coil power supply included in said common controller to achieve in said magnetic probe selected in said step of selecting a predetermined value of main magnetic field homogeneity.

39. The method according to claim 38 wherein said shim currents are selected from shim currents flowing through one or more gradient coils included in said magnetic probe, shim currents flowing through one or more shim coils included in said magnetic probe and a combination thereof.

40. The method according to claim 37, wherein said pre-calibration parameter set provided in said step of providing is included in a software program provided with said magnetic probe said software program is executable by said common controller.

41. The method according to claim 37 wherein said step of automatically adjusting comprises the steps of:
   tuning a radio frequency receiver and a radio frequency transmitter included in said common controller and operatively connected to said at least one radio frequency coil of said magnetic probe selected in said step of selecting in accordance with the pre-calibration parameter set provided in said step of providing;
   calibrating gradient coil amplifiers included in said common controller and operatively connected to said gradient coils of said magnetic probe selected in said step of selecting for generating gradient coil currents in accordance with said pre-calibration parameter set provided in said step of providing.

42. The method according to claim 37 wherein at least one magnetic probe of said plurality of magnetic probes further comprises at least one shim coil.

43. A controller used in a multi-probe system for performing magnetic resonance imaging and magnetic resonance therapy, the controller is operatively connectable to a magnetic probe selected from a plurality of magnetic probes, each magnetic probe of said plurality of magnetic probes comprises at least one magnet, at least one radio frequency coil and gradient coils adapted for performing said magnetic resonance imaging, the controller comprising:
   a selecting unit for selecting a magnetic probe from said plurality of magnetic probes;
   a calibrating unit for calibrating a magnetic probe selected from said plurality of magnetic probes; and
   a central electronics system for operating a magnetic probe selected from said plurality of magnetic probes to perform magnetic resonance imaging or magnetic resonance therapy.

44. The controller according to claim 43 wherein at least one magnetic probe of said plurality of magnetic probes is optimized for performing magnetic resonance imaging or magnetic resonance therapy of a specific body organ.

45. The controller according to claim 43, wherein at least one magnetic probe of said plurality of magnetic probes is a compact mobile magnetic probe adapted for use within an operating room.

46. The controller according to claim 43, wherein at least one magnetic probe of said plurality of magnetic probes is optimized for performing whole body magnetic resonance imaging or whole body magnetic resonance therapy.

47. The controller according to claim 43, wherein said central electronics system comprises a radio frequency system having a digital radio frequency receiver, said radio frequency receiver includes an analog to digital converter operative in conjunction with radio frequency receiver software for receiving and processing radio frequency signals within a frequency range extended to include all the frequencies required for operating any magnetic probe of said plurality of magnetic probes.

48. The controller according to claim 43 wherein at least one magnetic probe of said plurality of magnetic probes is adapted for performing magnetic resonance imaging or magnetic resonance therapy of a plurality of specific body organs.

49. The controller according to claim 43, wherein said radio frequency system comprises a digital radio frequency transmitter including a digital to analog converter operative in conjunction with radio frequency transmitter software for transmitting radio frequency signals within a frequency range extended to include all the frequencies required for operating any magnetic probe of said plurality of magnetic probes.

50. A controller for use in a multi-probe system for performing magnetic resonance imaging and magnetic resonance therapy, said controller is operatively connectable to a single magnetic probe selected from a plurality of magnetic probes, each magnetic probe of said plurality of magnetic probes includes at least one magnet for providing a main magnetic field and one or more gradient coils, the controller comprising:
   a selecting unit for selecting a single magnetic probe from said plurality of magnetic probes;
   at least one computer for controlling the operation of said single magnetic probe selected by said selecting unit;
   a radio frequency system operatively connected to said at least one computer and operatively connected to said selected magnetic probe, said radio frequency system is adapted to transmit and receive radio frequency signals;
   one or more gradient amplifiers operatively connectable to said one or more gradient coils of any magnetic probe selected from said plurality of magnetic probes, said one or more gradient amplifiers are adapted to power said one or more gradient coils.

51. The controller according to claim 50 wherein said single magnetic probe includes a radio frequency transmit coil and a radio frequency receive coil, said radio frequency system comprises:
   a synthesizer unit for providing synchronization signals;
   a radio frequency receiver operatively connected to said synthesizer and operatively connectable to said radio frequency receive coil of said single magnetic probe; and
   a radio frequency transmitter operatively connected to said synthesizer and operatively connectable to said radio frequency transmit coil of said single magnetic probe.

52. The controller according to claim 51 wherein said radio frequency transmitter is operatively connectable to said radio frequency transmit coil through a radio frequency amplifier.

53. The controller according to claim 51, wherein said radio frequency system includes a digital radio frequency transmitter comprising a digital to analog converter operative in conjunction with radio frequency transmitter software for transmitting radio frequency signals within a frequency range extended to include all the frequencies required for operating any radio frequency transmit coil of a plurality of radio frequency transmit coils adapted for use with said plurality of magnetic probes.

54. The controller according to claim 51, wherein said radio frequency system comprises a digital radio frequency receiver, said radio frequency receiver comprising an analog to digital converter operative in conjunction with radio frequency receiver software for receiving and processing radio frequency signals within a frequency range extended to include all the frequencies required for operating any radio frequency receive coil of plurality of radio frequency receive coils adapted for use with said plurality of magnetic probes.

55. The controller according to claim 50 wherein said at least one computer comprises a calibrating program embedded therein for calibrating a magnetic probe selected from said plurality of magnetic probes.

56. The controller according to claim 50 wherein said selecting unit comprises a plurality of switches for operatively connecting said single magnetic probe selected from said plurality of magnetic probes to said radio frequency system and to said one or more gradient amplifiers and for disconnecting the remaining non-selected magnetic probes of said plurality of magnetic probes from said radio frequency system and from said one or more gradient amplifiers.

57. The controller according to claim 56 wherein at least one magnetic probe of said plurality of magnetic probes includes at least one shim coil, and wherein said controller further comprises a shim power supply operatively connectable to said at least one shim coil for providing power to said at least one shim coil.

58. The controller according to claim 57 wherein at least one switch of said plurality of switches is operable to connect said at least one shim coil of said at least one of said plurality of magnetic probes to said shim power supply.

59. The controller according to claim 50, wherein said radio frequency system includes a digital radio frequency transmitter comprising a digital to analog converter operative in conjunction with radio frequency transmitter software for transmitting radio frequency signals within a frequency range extended to include all the frequencies required for operating any magnetic probe of said plurality of magnetic probes.

60. The controller according to claim 50, wherein said radio frequency system comprises a digital radio frequency receiver, said radio frequency receiver comprising an analog to digital converter operative in conjunction with radio frequency receiver software for receiving and processing radio frequency signals within a frequency range extended to include all the frequencies required for operating any magnetic probe of said plurality of magnetic probes.

61. A controller used in a multi-probe system for performing magnetic resonance imaging and magnetic resonance therapy, the controller is connectable to at least one magnetic probe of a plurality of magnetic probes, each magnetic probe of said plurality of magnetic probes includes at least one magnet, at least one radio frequency coil and gradient coils adapted for performing said magnetic resonance imaging, the controller comprising:

means for selecting one magnetic probe of said plurality of magnetic probes;

means for operating the magnetic probe selected by said means for selecting; and means for automatically adjusting said means for operating to operate with the magnetic probe selected by said means for selecting, using a pre-calibration parameter set associated with said magnetic probe selected by said means for selecting.

62. A controller used in a multi-probe system for performing magnetic resonance imaging and magnetic resonance therapy, the controller is operatively connectable to a magnetic probe selected from a plurality of magnetic probes, each magnetic probe of said plurality of magnetic probes comprises at least one magnet, at least one radio frequency coil and gradient coils adapted for performing said magnetic resonance imaging, the controller comprising:

a selecting unit for selecting a magnetic probe from said plurality of magnetic probes;

a calibrating unit for calibrating a magnetic probe selected from said plurality of magnetic probes; and a central electronics system for adapting said controller to operate said magnetic probe selected by said selecting unit from said plurality of magnetic probes in accordance with a pre-calibration parameter set associated with said magnetic probe selected by said selecting unit from said plurality of magnetic probes, to perform magnetic resonance imaging or magnetic resonance therapy.

63. A system for performing magnetic resonance imaging and magnetic resonance therapy, the system comprising:

a plurality of magnetic probes, each magnetic probe of said plurality of magnetic probes includes at least one magnet and gradient coils adapted for performing said magnetic resonance imaging, each magnetic probe of said plurality of magnetic probes is adapted to operate in conjunction with at least one radio frequency coil to perform said magnetic resonance imaging; and a controller operatively connectable to each magnetic probe selected from said plurality of magnetic probes for calibrating and operating any magnetic probe selected from said plurality of magnetic probes.

* * * * *

UNITED STATES PATENT AND TRADEMARK OFFICE
CERTIFICATE OF CORRECTION

PATENT NO. : 6,242,919 B1
DATED : June 5, 2001
INVENTOR(S) : Zuk, Yuval et al.

It is certified that error appears in the above-identified patent and that said Letters Patent is hereby corrected as shown below:

Drawings,
Figure 3 step 68, "LASS" should be replaced with -- LESS --.

Signed and Sealed this

Twenty-sixth Day of March, 2002

Attest:

Attesting Officer

JAMES E. ROGAN
Director of the United States Patent and Trademark Office